(12) United States Patent
Furukawa et al.

(10) Patent No.: US 7,027,272 B2
(45) Date of Patent: Apr. 11, 2006

(54) MAGNETORESISTANCE EFFECT DEVICE, AND MAGNETORESISTANCE EFFECT MAGNETIC HEAD

(75) Inventors: Akio Furukawa, Tokyo (JP); Satoru Ishi, Tokyo (JP)

(73) Assignee: Sony Corporation, Tokyo (JP)

( * ) Notice: Subject to any disclaimer, the term of this patent is extended or adjusted under 35 U.S.C. 154(b) by 370 days.

(21) Appl. No.: 10/203,126

(22) PCT Filed: Dec. 4, 2001

(86) PCT No.: PCT/JP01/10592

§ 371 (c)(1),
(2), (4) Date: Dec. 2, 2002

(87) PCT Pub. No.: WO02/47182

PCT Pub. Date: Jun. 13, 2002

(65) Prior Publication Data

US 2003/0133234 A1    Jul. 17, 2003

(30) Foreign Application Priority Data

Dec. 4, 2000 (JP) ............................. 2000-368930

(51) Int. Cl.
*G11B 5/127* (2006.01)
(52) U.S. Cl. ................................ 360/324.12
(58) Field of Classification Search ...................... None
See application file for complete search history.

(56) References Cited

U.S. PATENT DOCUMENTS 634,495 A    10/1899    Brunnee et al.

(Continued)

FOREIGN PATENT DOCUMENTS

| JP | 2000-022236 | 1/2000 |
|----|-------------|--------|
| JP | 2000-030223 | 1/2000 |
| JP | 2000-228002 | 8/2000 |
| JP | 2000-228004 | 8/2000 |

(Continued)

*Primary Examiner*—George Letscher
(74) *Attorney, Agent, or Firm*—Sonnenschein, Nath & Rosenthal LLP

(57) ABSTRACT

A magneto-resistive effect element body 11 and a hard magnetic layer 12 for applying a bias magnetic field are disposed between opposing first and second magnetic shields 21 and 22, each made of a soft magnetic material. This magneto-resistive effect element body 11 is comprised of a lamination layer structure portion in which there are laminated at least a free layer the magnetization of which is rotated in response to an external magnetic field, a fixed layer, an antiferromagnetic layer for fixing the magnetization of the fixed layer and a spacer layer interposed between the free layer and the fixed layer. Then, the magneto-resistive effect element has a CPP type configuration in which a sense current flows to the magneto-resistive effect element body in the direction intersecting the film plane of the lamination layer film. Further, a detection magnetic field is introduced in the direction extending along the film plane direction of the lamination layer film and a bias magnetic field is applied in substantially the direction intersecting the direction in which the above-mentioned detection magnetic field is introduced and in the direction extending along the film plane. In this configuration, under the condition that the detection magnetic field is not applied to the magneto-resistive effect element, magnetic fields substantially applied to the front end and the rear end of the side in which the detection magnetic field is introduced, to be concrete, magnetic fields determined mainly by an induced magnetic field HI induced by the above-mentioned sense current and a bias magnetic field HB are set to the same directions, particularly, in the free layer, whereby a single magnetic domain is nucleated in the free layer with high stability.

10 Claims, 7 Drawing Sheets

U.S. PATENT DOCUMENTS 6,249,407 B1 6/2001 Aoshima et al.
6,473,279 B1 * 10/2002 Smith et al. ........... 360/324.12
2002/0012206 A1 1/2002 Kanno

FOREIGN PATENT DOCUMENTS

KR 2000-006501 1/2000

* cited by examiner

DISTANCE FROM TIP END OF FREE LAYER [nm]

DISTANCE FROM TIP END OF FREE LAYER [nm]

DISTANCE FROM TIP END OF FREE LAYER AND MAGNETIC FLUX GUIDE/TOTAL LENGTH

MAGNETORESISTANCE EFFECT DEVICE, AND MAGNETORESISTANCE EFFECT MAGNETIC HEAD

TECHNICAL FIELD

The present invention relates to a magneto-resistive effect element and a magnetic head using magneto-resistive head in which an output can be stabilized while a sensitivity can be avoided from being deteriorated.

BACKGROUND OF THE INVENTION

A magnetic sensor or a magnetic head using a spin-valve type magneto-resistive effect (hereinafter referred to as an "SV type GMR") element or a tunnel type magneto-resistive effect (hereinafter referred to as a "TN type MR") element is able to detect a change of an external magnetic field based upon a magnetic resistance change generated by a change of a relative angle between a free layer and a fixed layer whose magnetization is fixed by an antiferromagnetic layer when the magnetization of the free layer made of a soft magnetic material is rotated in response to the external magnetic field.

In this case, in order to detect the external magnetic field at a high efficiency, by a method such as film deposition, annealing in the magnetic field, a uniaxial magnetic anisotropy is given to the free layer in the direction perpendicular to the direction in which an external magnetic field is introduced. As a consequence, although the magnetization of the free layer tends to orient in the two directions extending along this magnetic anisotropy (the forward direction or the reverse direction relative to the magnetic field to which the anisotropy is given), which direction of the above two directions the magnetization of the free layer is oriented without application of the external magnetic field is not prescribed. As a result, the above-mentioned magnetic sensor and the above-mentioned magnetic head cannot detect the change of the external magnetic field with an excellent reproducibility.

On the other hand, at the end portion of the free layer in the direction perpendicular to the aforementioned magnetic anisotropy direction (hereinafter referred to as a "side end portion"), the magnetization becomes difficult to orient in the magnetic anisotropy direction due to an antimagnetic field so that a magnetic domain occurs, which causes a so-called Barkhausen noise which causes the rotation of the magnetization to become discontinuous when the magnetization is rotated in response to the external magnetic field.

Accordingly, when the bias magnetic field is applied to the free layer in one direction of the above-mentioned magnetic anisotropy direction in an opposing relation to the side end portion of the free layer, under the condition that other magnetic field is not applied to the free layer, the free layer is nucleated as a single magnetic domain by confining its magnetization direction in a constant direction. As a result, the occurrence of the magnetic domain in the above-mentioned free end of the free layer can be avoided, the Barkhausen noise can be avoided, and the resistance change of the magneto-resistive effect element can be reproduced by the detection magnetic field with an excellent reproducibility and at an excellent stability.

Although this bias magnetic field needs a magnetic field intensity high enough to nucleate the free layer as the signal magnetic domain, when the intensity of the bias magnetic field is too high, a rotation angle at which the magnetization of the free layer is rotated in response to the external magnetic field becomes too small so that the sensitivity of the magneto-resistive effect element is lowered unavoidably. Therefore, the material and film thickness of the hard magnetic layer are selected in such a manner that the sensitivity of the magneto-resistive effect element becomes appropriate.

When the magneto-resistive effect element has a so-called CPP (Current Perpendicular to Plane) configuration in which a sense current flows in the direction perpendicular to the film plane of a magneto-resistive effect element body, i.e., in the direction perpendicular to the film plane of the free layer 1 as shown in FIG. 12, a current magnetic field HI generated in the free layer by this sense current Is is generated so as to circulate along the film plane.

At that time, at the respective central portions of a front end 1F of the free layer 1 and a rear end 1R on the opposite side of the front end, which is the side into which a detection magnetic field is introduced, the current magnetic fields become parallel to the direction in which the bias magnetic field HB is applied and also become opposite to each other.

Accordingly, as mentioned before, when the bias magnetic field HB is applied to the free layer of the magneto-resistive effect element MR, the current magnetic field HI acts in the direction in which the bias magnetic field HB is increased in intensity and also acts in the direction in which the bias magnetic field is decreased in intensity at any one of the center of the front end of the free layer and the center of the rear end of the free layer.

Therefore, in order to nucleate the free layer as the single magnetic domain, a bias magnetic field having an intensity high enough to prevent the bias magnetic fields from being canceled out should be applied to the portion in which the current magnetic field HI acts in the direction in which the intensity of the bias magnetic field is decreased.

However, this bias magnetic field becomes too high in intensity at the portion in which the current magnetic field acts in the direction in which the intensity of the bias magnetic field is increased, so that a sensitivity at this portion is lowered, accordingly, the output of the magneto-resistive effect element is decreased.

SUMMARY OF THE INVENTION

An object of the present invention is to provide a magneto-resistive effect element which can generate a stable output while making it possible to avoid a sensitivity from being lowered due to a current magnetic field caused by a sense current as described above and is also to provide a magnetic head using magneto-resistive head using this magneto-resistive effect element as a magnetic sensing portion.

According to the present invention, the direction of a sense current flowing to the direction intersecting, e.g., perpendicular to a film plane of a magneto-resistive effect element to which a bias magnetic field is applied is restricted to a specific direction, whereby a sensitivity partly lowered due to unequal current magnetic fields being canceled out by a bias magnetic field can be decreased. That is, there can be constructed a magneto-resistive effect element and a magnetic head using magneto-resistive head which are able to generate high output with high stability.

In a magneto-resistive effect element according to the present invention, a magneto-resistive effect element body and a hard magnetic layer for applying a bias magnetic field to the magneto-resistive effect element body are disposed between opposing first and second magnetic shields, each of which is made of a soft magnetic material.

The magneto-resistive effect body is comprised of a lamination layer structure portion in which there are laminated at least a free layer the magnetization of which is rotated in response to an external magnetic field, a fixed layer, an antiferromagnetic layer for fixing the magnetization of this fixed layer and a spacer layer interposed between the free layer and the fixed layer.

Then, the magneto-resistive effect element has a CPP type configuration in which a sense current flows to the magneto-resistive effect element body in the direction crossing the film plane of its lamination layer film. Moreover, a detection magnetic field is introduced in the direction extending along the film plane direction of the lamination layer film, and a bias magnetic field is applied to substantially the direction which intersects the direction in which the above-mentioned detection magnetic field is introduced and in the direction extending along the film plane of the lamination layer film.

According to the present invention, in this configuration, particularly in the free layer, under the condition that the detection magnetic field is not applied to the magneto-resistive effect element, magnetic fields substantially applied to this free layer at the front end and the rear end of the side into which this detection magnetic field is introduced, to be concrete, magnetic fields determined mainly by an induced magnetic field (hereinafter referred to as a "current magnetic field HI") generated by the above-mentioned sense current and a bias magnetic field HB are set to the same direction.

Further, in the magnetic head using magneto-resistive head according to the present invention, its magnetic sensing portion is comprised of the above-mentioned magneto-resistive effect element according to the present invention.

As described above, according to the present invention, the magnetic head using magneto-resistive head has the magnetic shield type configuration in which the magneto-resistive effect element is disposed between the first and second magnetic shields and has also the CPP type configuration. Under the condition that the detection magnetic field is not applied to the magneto-resistive effect element, directions HF and HR of magnetic fields applied to this free layer are set to the same direction at the front end and the rear end of the free layer, in actual practice, at the central portions of the front end and the rear end, whereby an occurrence of a magnetic domain can be avoided in substantially the whole region of the side end portion of the free layer. As a result, there can be constructed the magneto-resistive effect element and the magnetic head using magneto-resistive head in which a Barkhausen noise can effectively be improved, accordingly, the magneto-resistive effect element and the magnetic head using magneto-resistive head which are stable and excellent in reproducibility.

Then, in this configuration in which |HF|>|HR| is fundamentally satisfied, i.e., in the configuration in which a magnetic field in the direction perpendicular to the detection magnetic field is increased in intensity in the front portion in which an amount of detection magnetic flux is large, the magneto-resistive effect element and the magnetic head using magneto-resistive head can be made stable. On the contrary, in the configuration in which |HF|<|HR| is satisfied, the magneto-resistive effect element and the magnetic head using magneto-resistive head can be increased in sensitivity.

However, as will be described later on, for example, with the structures in which the magneto-resistive effect element and the magnetic head using magneto-resistive head include magnetic flux guides, under the condition in which the magnetic fields HF and HR are selected so as to orient in the same direction, the setting of a relationship between the magnetic fields HF and HR and a relationship between the sensitivity and the stability can be selected arbitrarily.

DETAILED DESCRIPTION OF THE PRESENTLY PREFERRED EMBODIMENTS

A magneto-resistive effect (MR) element according to the present invention and an MR type magnetic head using this inventive magneto-resistive effect element will be described.

Figure 1:
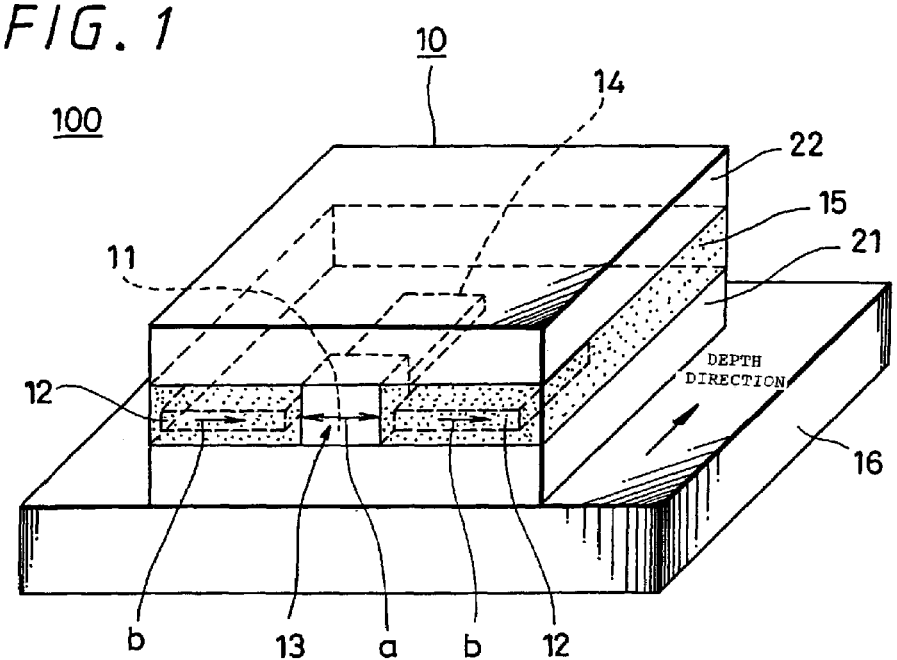
FIG. 1 is a schematic perspective view showing a magneto-resistive effect element and a magnetic head according to an embodiment of the present invention.
Figure 2:
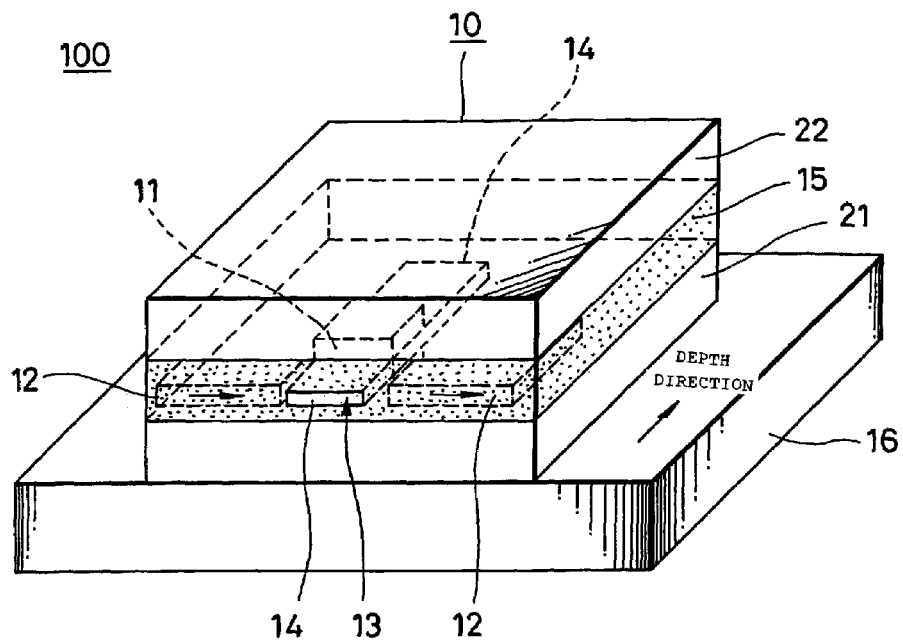
FIG. 2 is a schematic perspective view showing a magneto-resistive effect element and a magnetic head according to another embodiment of the present invention.

FIGS. 1 and 2 show schematic perspectives of an MR element 10 and an MR type magnetic head 100 using this inventive magneto-resistive element according to the present invention, respectively.

The MR element 10 includes an MR element body 11 and a hard magnetic layer 12 for applying a bias magnetic field to this magneto-resistive effect element body disposed between first and second magnetic shields opposing to each other, e.g., first and second electrode and magnetic shields 21 and 22 serving as electrodes as well and each of which is made of a soft magnetic material having a conductivity.

The example shown in FIG. 1 shows the case in which the MR element body 11 is disposed in a facing relation to a surface into which a detection magnetic field is introduced, i.e., a forward surface 13. FIG. 2 shows the case in which the MR element body 11 is disposed at a position retreated from this forward surface 13 in the depth direction such that a detection magnetic field introduced from this forward surface 13, i.e., in a magnetic head, a signal magnetic field from a recording portion of a magnetic recording medium (not shown) is introduced into the MR element body 11 by a magnetic flux guide layer 14.

This magnetic flux guide layer 14 can be formed as a free layer and magnetic flux guide layer or this magnetic flux guide layer can be bonded to the free layer.

In FIGS. 1 and 2, it is to be desired that the magnetic flux guide layers 14 should be disposed behind the respective MR element bodies 11 or the magnetic flux guide layers should be extended from the rear portions of the respective magneto-resistive effect element bodies.

A nonmagnetic insulating layer 15 made of $Al_2O_3$, for example, is buried between the first and second electrode and magnetic shields 21 and 22.

First Embodiment

Figure 3:
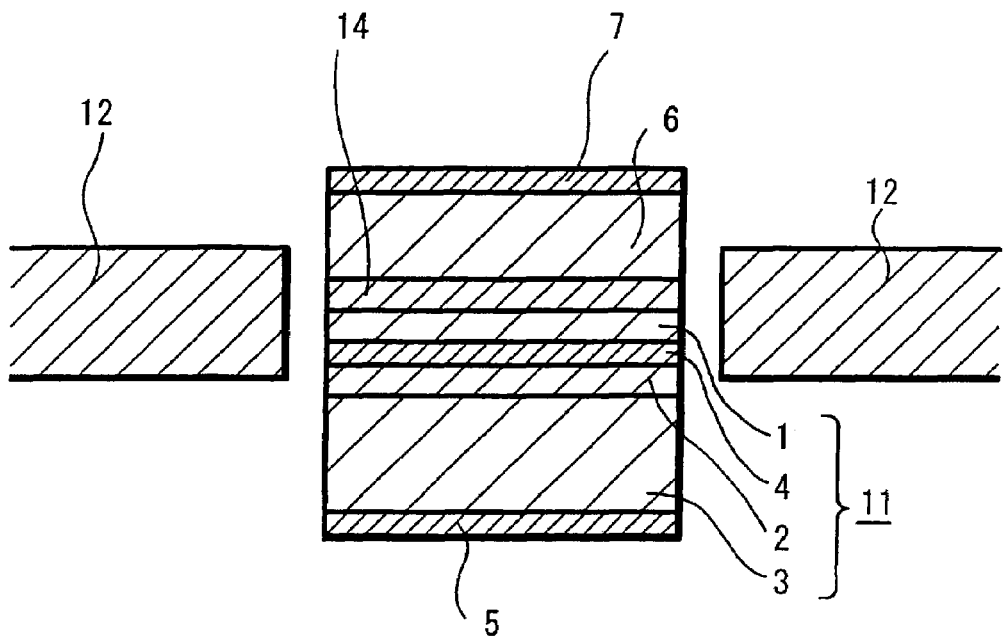
FIG. 3 is a schematic cross-sectional view showing a magneto-resistive effect element body according to an embodiment of the present invention.

In this embodiment, the magneto-resistive effect element has a single SV type GMR configuration. In this case, as FIG. 3 shows a schematic cross-sectional view thereof, its MR element body 11 has a lamination layer structure comprising at least a free layer 1 the magnetization of which is rotated in response to a detection magnetic field, a fixed layer 2, an antiferromagnetic layer 3 for fixing a magnetization of this fixed layer 2 and a spacer layer 4 interposed between the free layer 1 and the fixed layer 2. In the illustrated example, this magneto-resistive effect element has a configuration in which an underlayer 5 is formed on the lower surface of the antiferromagnetic layer 3 and in which a magnetic flux guide layer 14, a magnetic gap layer 6 and a capping layer 7 are formed on the free layer 1.

As shown in FIG. 1 or 2, this MR element body 11 is disposed between the first and second electrode and magnetic shields 21 and 22 in such a manner that the plane directions of the respective layers of the MR element body 10 become parallel to these shields 21 and 22.

In this case, on a substrate 16 made of an AlTiC (AlTiC) layer having a thickness of 100 μm, for example, there is formed the first electrode and magnetic shield 21 made of an NiFe layer having thickness of 2 μm by plating, for example, on which the underlayer 5 shown in FIG. 3 is deposited by sputtering. Subsequently, on this underlayer, there are deposited the antiferromagnetic layer 3, the fixed layer 2, the spacer layer 4 and the free layer 1 by sputtering, in that order, thereby resulting in a lamination layer film of the antiferromagnetic layer 3, the fixed layer 2, the spacer layer 4 and the free layer 1 being formed. Then, a first stripe portion is formed by patterning this lamination layer film like a stripe extending along the track width direction, for example.

An insulating layer 15 made of $SiO_2$ or $Al_2O_3$, for example, is formed so as to bury this first stripe portion, and a flat surface to which the free layer 1 is faced is formed. An NiFe layer, for example, comprising the magnetic flux guide layer 14, for example, is formed on this flat surface and a second stripe portion is formed like a stripe extending in the thickness direction including this layer and the above-mentioned stripe portion below this layer, i.e., in the direction perpendicular to the aforementioned stripe direction by patterning.

In this manner, the above-mentioned lamination layer film is left in only the portion at which the first and second stripe portions cross each other, whereby the MR element body 11 like a square one side of which is 100 nm, for example, and which is based upon the lamination layer structure portion of the antiferromagnetic layer 3, the fixed layer 2, the spacer layer 4 and the free layer 1 is constructed.

Then, there is formed the stripe-like magnetic flux guide layer 14 under which there are laminated the insulating layer 15 made of $SiO_2$ or $Al_2O_3$, for example, the hard magnetic layer 12 and the similar insulating layer 15 so as to bury the second stripe portion including the MR element body 11 based upon the above-mentioned lamination layer structure portion, e.g., so as to be deposited on both side surfaces of the second stripe portion, for example. Then, the insulating layer 15 and the hard magnetic layer 12 are selectively removed from the second stripe portion by a lift-off method, for example, whereby the surface can be made flat. As shown in FIG. 3, on this flat surface, there are formed the gap layer 6 and the capping layer 7 on which there is further formed the second electrode and magnetic shield 22 formed of the NiFe plating layer having a thickness of 2 μm, for example.

In the MR element body 11 formed between the first and second electrode and magnetic shields 21 and 22 as described above, the thickness of the gap layer 7 shown in FIG. 3, for example, is selected in such a manner that the free layer 1 and the magnetic flux guide layer 14 may be located at substantially the center between the first and second electrode and magnetic shields 21 and 22.

Then, the hard magnetic layers 12 are disposed at the positions opposing to respective side end portions of this free layer 1.

The free layer 1 and the fixed layer 2 can be each formed of a CoFe film having a thickness of 5 nm, for example.

The free layer 1 is given a uniaxial anisotropy of an anisotropic magnetic field of 5 [Oe] in the film plane direction shown by an arrow a in FIG. 1, for example, by film deposition in the magnetic field generated by a magnetic field of 500 [Oe], for example, and by vacuum annealing for 1 hour in the magnetic field generated by a magnetic field of 1000 [Oe] at 200° C.

The spacer layer 4 interposed between these free layer 1 and fixed layer 2 can be formed of a conductive layer, for example, a Cu layer having a thickness of 3 nm, for example.

Moreover, the antiferromagnetic layer 3 can be formed of a PtMn film, for example, having a thickness of 34.5 nm, for example.

The hard magnetic layers 12 are magnetized as shown by arrows b in one direction which is the same direction as that of the anisotropic magnetic field of the free layer as shown in FIGS. 1 and 2.

When the hard magnetic layers 12 are buried by the insulating layer 15 and thereby electrically separated from the MR element body 11, they can be each formed of a conductive CoCrPt film having a thickness of 40 nm, for example. The residual magnetization of the hard magnetic layers 12 formed of the CoCrPt film is 670 [emu/cm³]. Moreover, when the hard magnetic layers 12 are not electrically separated from the MR element body 11, these hard magnetic layers can be made of a Co—$Fe_2O_3$ film having a high resistance.

The underlayer 5 and the capping layer 7 can be each formed of a Ta film having a thickness of 3 nm, respectively.

The magnetic gap layer 6 can be formed of a nonmagnetic film, e.g., Cu film having a thickness of 34.5 nm.

In this configuration, the magnetic flux guide layer 14 can also serve as the free layer 1 as well.

Then, the forward surface 13 can be formed by polishing and the MR element body 11 can be directly faced to the forward surface, whereby the magnetic flux guide layer 14 can be extended from the magneto-resistive effect element body to the rearward as shown in FIG. 1. Alternatively, as shown in FIG. 2, the front end of the magnetic flux guide layer 14 may be faced to the forward surface 13 and the MR element body 11 may be located at the position retreated from the front end of the magnetic flux guide layer in the depth direction.

In the magnetic head 100 using this MR element 10, the forward surface 13 comprises a surface by which the magnetic head 100 is brought in contact with a magnetic recording medium or the magnetic head is opposed to the magnetic recording medium.

In a flying type magnetic head, for example, this forward surface serves as a so-called ABS surface (Air Bearing Surface) by which the magnetic head can fly over a recording medium surface with a required space between them due to an air flow generated by a relative movement of a magnetic recording medium, e.g., a magnetic disk and a magnetic head.

Then, according to the present invention, this configuration serves as a CPP type configuration in which a sense current is flowing between the first and second electrode and magnetic shields 21 and 22, i.e., the MR element body 11 in the direction intersecting the film plane of the lamination layer film.

Further, the detection magnetic field may be introduced along the film plane direction of the lamination layer film. At the same time, the bias magnetic field HB generated by the hard magnetic layer 12 may be applied not only in the direction intersecting substantially the direction in which the above-mentioned detection magnetic field is introduced but also in the direction along the film plane, i.e., in the direction along the anisotropic magnetic field direction, shown by the arrow a, of the free layer, e.g., in the direction shown by the arrow b.

Then, according to the present invention, in the above-mentioned configuration, for example, in particular, in the free layer, as will be described later on in detail, under the condition that the detection magnetic field is not applied to the magneto-resistive effect element, magnetic fields which are substantially applied to the front end and the rear end of the side into which the detection magnetic field is introduced, to be concrete, magnetic fields determined by mainly the induced magnetic fields generated by the above-mentioned sense current, i.e., magnetic fields determined by the current magnetic field HI and the above-mentioned bias magnetic field HB are set to the same direction.

Second Embodiment

Figure 5:
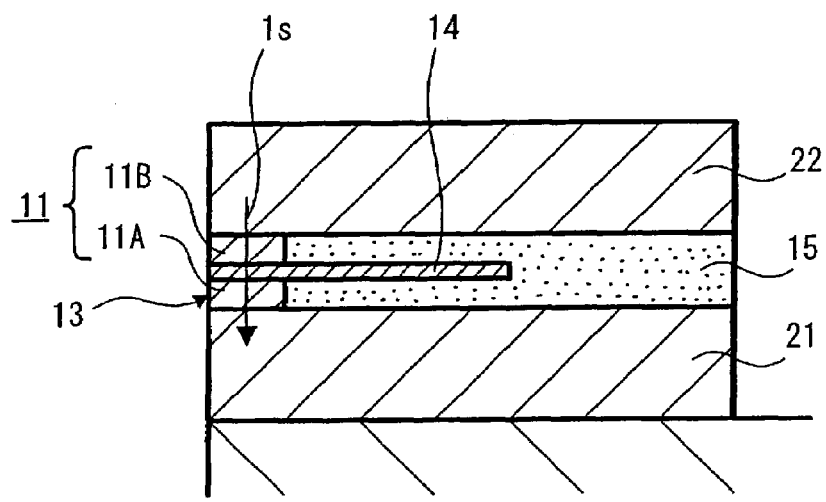
FIG. 5 is a schematic cross-sectional view showing a magneto-resistive effect element and a magnetic head according to an embodiment of the present invention.
Figure 6:
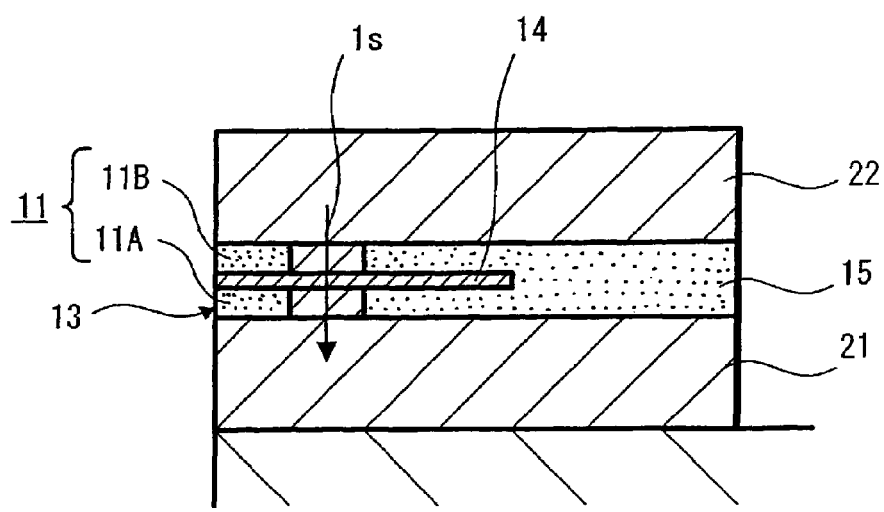
FIG. 6 is a schematic cross-sectional view showing a magneto-resistive effect element and a magnetic head according to another embodiment of the present invention.

In this embodiment, as FIGS. 5 and 6 show schematic longitudinal cross-sectional views of FIGS. 1 and 2, the magneto-resistive effect element has a so-called dual SV type GMR element 10 in which MR element bodies 11A and 11B having a pair of SV type GMR configurations are symmetrically disposed across a common magnetic flux guide layer or a free layer and magnetic flux guide layer 14.

Figure 4:
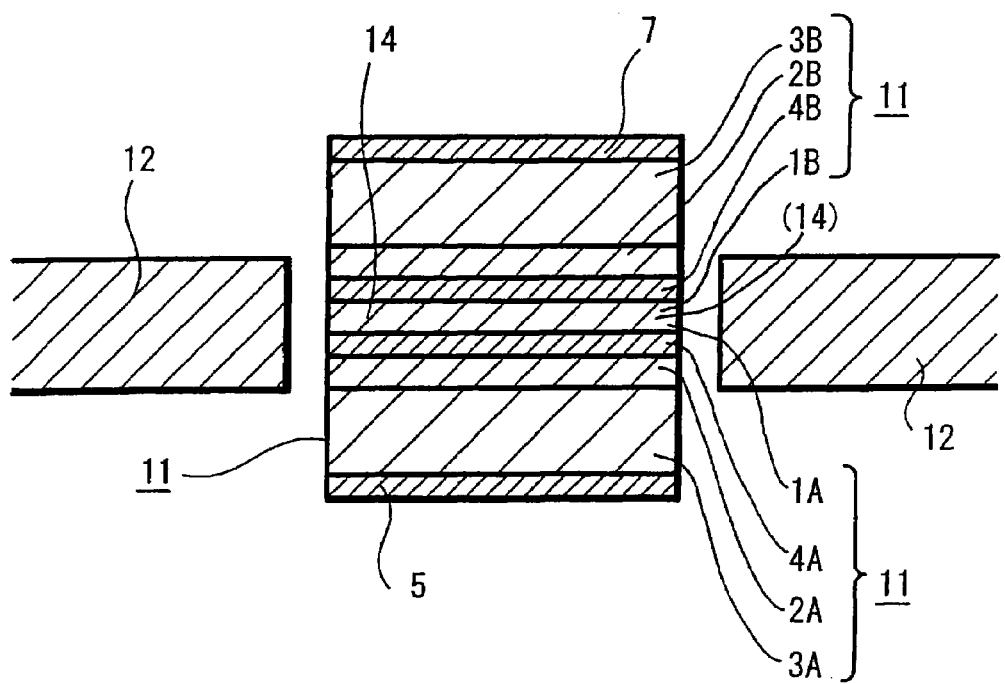
FIG. 4 is a schematic cross-sectional view showing a magneto-resistive effect element body according to another embodiment of the present invention.

Particularly, in this case, as FIG. 4 shows a schematic cross-sectional view of its MR element body 11, spacers 4A and 4B, fixed layers 2A and 2B and antiferromagnetic layers 3A and 3B comprising the respective element bodies 11A and 11B are disposed at both surfaces of the free layer and magnetic flux guide layer 14 which serves also as the free layers 1A and 1B as well.

In FIG. 4, elements and parts identical to those of FIG. 3 are denoted by identical reference numerals and therefore an overlapping explanation will be omitted.

The free layer and magnetic flux guide layer 14, the spacer layers 4A and 4B, the fixed layers 2A and 2B and the antiferromagnetic layers 3A and 3B may have configurations similar to those of the free layer 1 or the magnetic flux guide layer 14, the spacer layer 4, the fixed layer 2 and the antiferromagnetic layer 3 in the aforementioned first embodiment, for example.

Also in this embodiment, in the magnetic head 100 using this MR element 10, its forward surface 13 comprises a surface by which the magnetic head comes in contact with and is opposed to a magnetic recording medium. In a flying type magnetic head, for example, this forward surface serves as what might be called an "ABS surface" (Air Bearing Surface) by which the magnetic head can fly over a recording medium surface by a required space owing to an air flow produced when a magnetic recording medium, e.g., a magnetic disk and the magnetic head are moved in a relative relationship between them.

Further, also in this case, the magneto-resistive effect element has the CPP type configuration in which the sense current flows between the first and second electrode and magnetic shields 21 and 22, i.e., the MR element body 11 in the direction crossing the film plane of its lamination layer film.

Furthermore, the detection magnetic field is introduced into the direction extending along the film plane direction of the lamination layer film. At the same time, the bias magnetic field HB caused by the hard magnetic layer 12 is applied to the direction crossing the direction in which the above-mentioned detection magnetic field is introduced and in the direction extending along the film plane, i.e., in the direction extending along the anisotropic magnetic field direction shown by the arrow a in the free layer, e.g., one direction shown by the arrow b.

Then, according to the present invention, in such configuration, for example, particularly in the free layer, under the condition that the detection magnetic field is not applied to the magneto-resistive effect element, as will be described later on, magnetic fields substantially applied to this free layer at the front end and the rear end of the side into which this detection magnetic field is introduced, to be concrete, magnetic fields determined by mainly the induced magnetic field generated by the above-mentioned sense current, i.e., the current magnetic field HI and the above-mentioned bias magnetic field HB are set to the same direction, particularly, in the free layer.

Third Embodiment

In this embodiment, the magneto-resistive effect element has a TN type MR configuration. In this embodiment, the magneto-resistive effect element has a similar configuration to that of the first embodiment and is different only in that the spacer layer in the aforementioned first embodiment is formed of an $Al_2O_3$ layer which is what might be called a tunnel barrier layer formed by treating an Al layer having a thickness of 0.6 nm by anodic oxidation.

Fourth Embodiment

In this embodiment, the magneto-resistive effect element has a TN type MR configuration. In this embodiment, the magneto-resistive effect element has a similar configuration to that of the above-mentioned second embodiment and is different only in that the spacer layer in the aforementioned second embodiment is formed of an $Al_2O_3$ layer which is what might be called a tunnel barrier layer formed by treating an Al layer having a thickness of 0.6 nm by anodic oxidation.

As mentioned before, according to the MR element 10 or the magnetic head 100 of the present invention, in the free layer, under the condition that the detection magnetic field is not applied to the magneto-resistive effect element, as will be described later on in detail, magnetic fields substantially applied to the free layer at the front end and the rear end of the side in which this detection magnetic field is introduced, to be concrete, magnetic fields determined by mainly the induced magnetic field generated by the above-mentioned sense current, i.e., the current magnetic field HI and the above-mentioned bias magnetic field HB are set to the same direction, particularly, in the free layer. This will be described.

Figure 7:
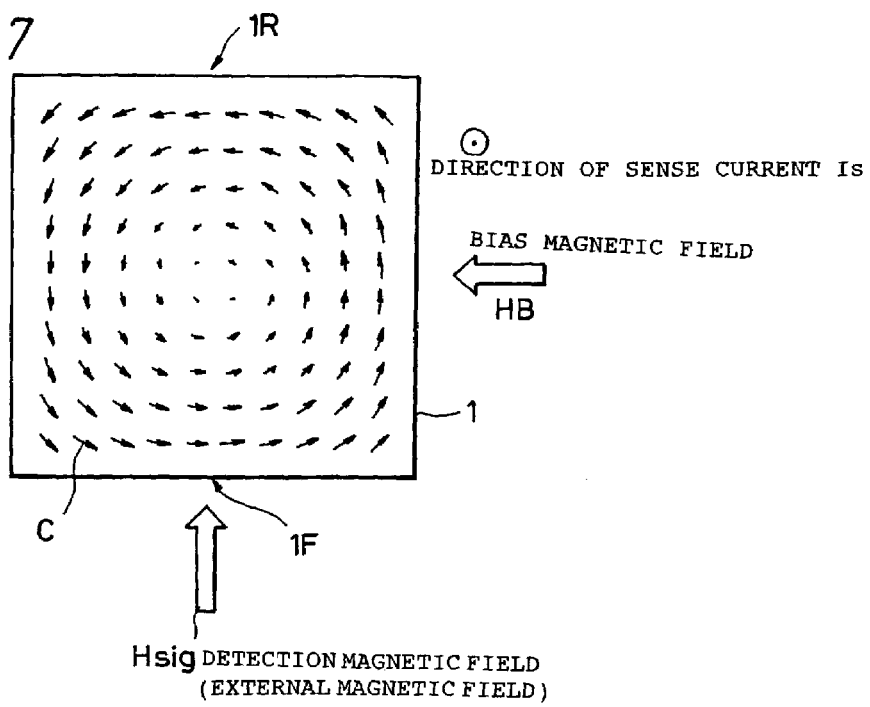
FIG. 7 is a diagram to which reference will be made in explaining the present invention and which shows an induced current induced by a sense current flowing through a free layer.

FIG. 7 shows the bias magnetic field direction HB of the bias magnetic field applied to the free layer 1 and a current magnetic field (shown by an arrow c) within the film plane as is obtained by a numerical calculation based upon a finite element method. FIG. 7 shows the state in which the sense current Is flows to the upper direction perpendicular to the sheet of the drawing.

In the present invention, at respective central portions of a front end 1F and a rear end 1R of this free layer 1, the directions of the magnetic fields applied to this free layer 1 are set to the direction extending along the anisotropic magnetic field of the free layer 1 and the same direction.

This will be described.

Figure 8:
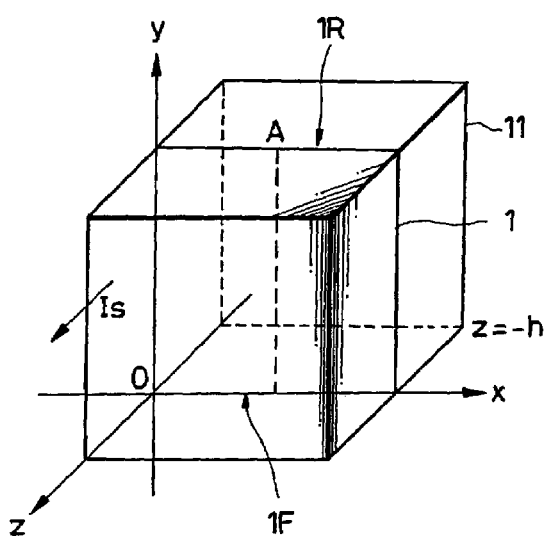
FIG. 8 is a diagram to which reference will be made in explaining the present invention and which shows a coordinate system.
Figure 9A:
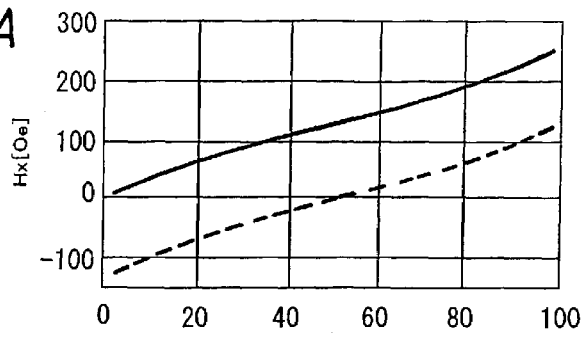
FIGS. 9A and 9B graphically illustrate how a magnetic field component, Hx, may be calculated in accordance with the present invention, FIG. 9C graphically illustrates how the attenuation degree of a magnetic field may be calculated in accordance with the present invention.

When a magnetic field component Hx in a direction x perpendicular to an external magnetic field Hsig of the current magnetic field HI on a center line parallel to the external magnetic field (detection magnetic field) Hsig of the free layer is calculated from the Bio-Savart Law and the following equation (1) obtained from a coordinate system defined as shown in FIG. 8, this component is calculated as shown by a dashed line in FIG. 9A. In this case, in the magnetic field component Hx, a polarity of the same direction as that of the bias magnetic field HB is set to a positive polarity.

$$H_x(x, y, z = 0) = \tag{Equation 1}$$

$$\frac{I_s}{10} \int_{x'=0}^{x'=L} \int_{y'=0}^{y'=L} \int_{z'=-h}^{z'=h} \frac{y' - y}{(z'^2 - R^2)^{3/2}} dz' dy' dx'$$

wherein $$R = \sqrt{(x-x')^2 + (y-y')^2}$$

$H_x$: x component(Oe) of current magnetic field
x,y,z : position in the device (cm)
$I_s$: sense current (A)

In this case, since the current magnetic field component Hx in the tip, i.e., the front end 1F is −120 [Oe] and becomes larger than the magnetic anisotropic magnetic field, it is to be understood that the free layer 1 cannot be nucleated as a single magnetic domain without application of the bias magnetic field HB. Then, in this case, at the lowest, there is required the intensity of the bias magnetic field such that the direction of the synthesized magnetic field of the current magnetic field component Hx and the bias magnetic field HB become the same direction at the center line A in which the magnetic field component Hx becomes largest.

Therefore, characteristics of the material and the film thickness of the hard magnetic layer 12 are adjusted in such a manner that the bias magnetic field applied onto the center line A may exceed 120 [Oe], e.g., may reach 130 [Oe]. As a consequence, the synthesized magnetic field on the center line A is obtained as shown by a solid curved line in FIG. 9A.

With this configuration, the synthesized magnetic field of the current magnetic field HI and the bias magnetic field HB are oriented in the same direction in the direction crossing, e.g., perpendicular to the direction of the external magnetic field (detection magnetic field) Hsig not only on the center line A but also in the whole region of the free layer 1 with the result that the free layer 1 can be nucleated as a single magnetic domain in its whole region.

However, at that time, a synthesized magnetic field as large as 270 [Oe] is applied to the rear end 1R of the free layer 1. Hence, it is to be considered that a sensitivity is lowered at the rear end of the free layer 1.

However, in the above-mentioned configuration of the present invention, since the magneto-resistive effect element has the configuration in which the MR element 10 is sandwiched between the first and the second magnetic shields 21 and 22, i.e., the so-called shield type configuration, a region in which the detection magnetic field is introduced i.e., a detection space is limited so that a resolution of the magneto-resistive effect element can be increased. According to the shield type configuration, when magnetic flux of the detection magnetic field is propagated from the front end (tip) of the free layer to the rear end, it is customary that a magnetic field is attenuated due to the leakage of magnetic flux leaked to the shields 21 and 22 adjacent to the magneto-resistive effect element body.

It is well known that a degree to which this magnetic field is attenuated by the leakage of the magnetic flux can be expressed as in the following equation (3) by using a magnetic flux penetration characteristic length λ defined in the following equation (2).

$$\lambda = \sqrt{\frac{\mu g t}{2}} \tag{Equation 2}$$

μ: magnetic permeability of the free layer
g: distance from the free layer to the shield
t: layer thickness of the free layer $$\Phi(y) = \Phi(0) \frac{\sinh((D-y)/\lambda)}{\sinh(D/\lambda)} \tag{Equation 3}$$

Φ(y): magnetic flux at the distance y from the top end of the free layer, i.e., the magnetic flux guide
D: distance from the front end to the rear end of free layer, i.e., the magnetic flux guide
λ: flux penetration characteristic length shown by the equation 2.

Figure 9B:
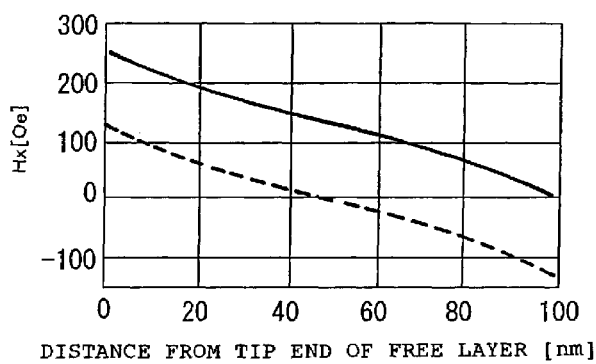
Figure 9C:
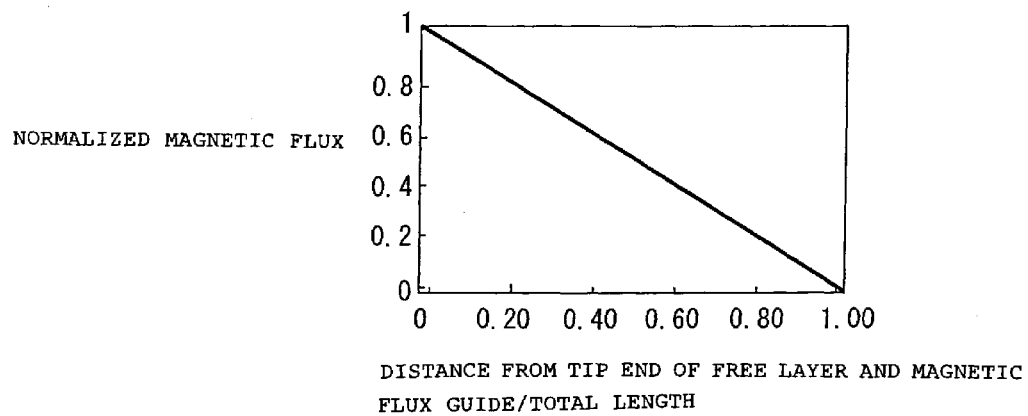

In the above-mentioned configuration of the present invention, the attenuation degree of the magnetic field is calculated as shown in FIG. 9C. From FIG. 9C, it is to be understood that the magnetic flux is thoroughly attenuated at the rear end portion of the free layer 1. That is, it is to be understood that the contribution of the attenuation of the magnetic flux to the magnetic resistance change in the rear end portion 1R is extremely small compared with the front end 1F. Therefore, as mentioned before, even when the magnetic field of the x direction component is remarkably increased at the rear end portion of the free layer 1, it is possible to avoid a trouble caused by such increased magnetic field.

On the other hand, if the sense current flows in the direction opposite to the direction in which the sense current Is flows as shown in FIG. 7, then when the similar component Hx in the direction x perpendicular to the external magnetic field Hsig at the center line A is calculated, such component is calculated as shown by a dashed line in FIG. 9B. Further, when a bias magnetic field necessary for nucleating the free layer 1 as the single magnetic domain is applied to the free layer, the above component is calculated as shown by a solid line in FIG. 9B.

Then, in this case, although a sensitivity can be increased near the rear end portion 1R of the free layer 1, a benefit of such increased sensitivity can hardly be obtained due to the above-mentioned magnetic flux attenuation effect.

That is, according to the present invention, by selecting a relationship between the direction and intensity of the bias magnetic field HB and a relationship between the conducting direction and conducting current amount of the sense current, i.e., the direction and intensity of the current magnetic field HI, the change of the magnetic field of the detection magnetic field Hsig can be detected more efficiently, i.e., a high reproduced output can be realized.

Figure 10:
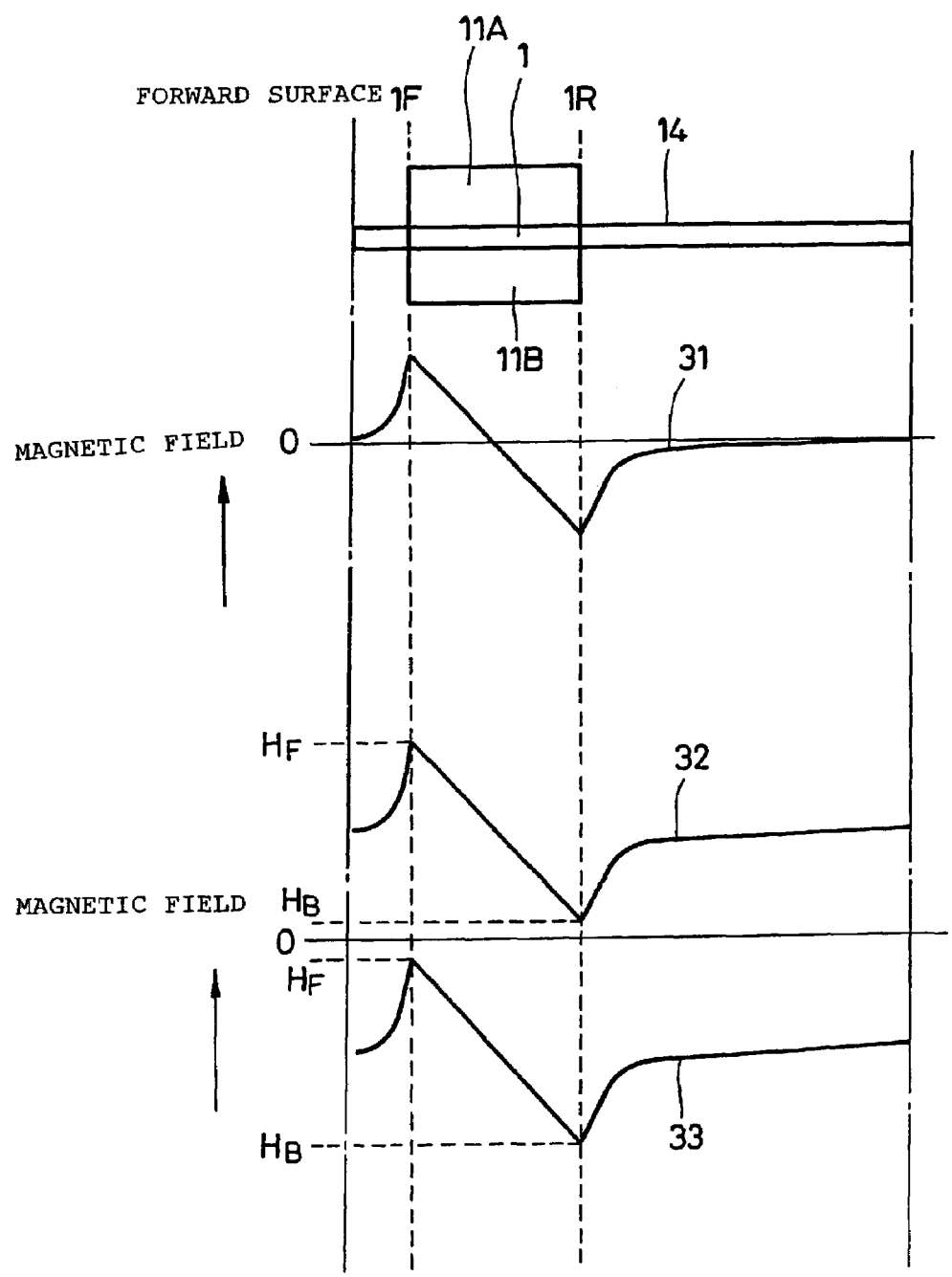
FIG. 10 is a diagram showing distributions of magnetic fields generated in the depth direction of the magneto-resistive effect element.

This will further be described with reference to FIG. 10. In this sheet of drawing, there are illustrated magnetic field distributions obtained in a dual type MR element in which a pair of MR element bodies 11A and 11B are disposed across the free layer 1 and magnetic flux guide layer 14. In FIG. 10, a curve 31 shows a magnetic field distribution of the current magnetic field HI obtained under the condition that only the sense current flows to the free layer, i.e., under the condition that the bias magnetic field is not applied to the free layer. A curve 32 shows a magnetic field distribution obtained when the bias magnetic field HB of the same direction as that of the magnetic field HI in the front end 1F of the free layer 1 is applied to this current magnetic field HI. Although magnetic fields HF and HR of total sums (hereinafter referred to as "total sum magnetic fields") of the current magnetic fields HI and the bias magnetic fields HB of the front end side and the rear end side are set to the same direction, the intensities of these current magnetic fields are assumed to be |HF|>|HR|.

A curve 33 shows a magnetic field distribution obtained when the bias magnetic field HB in the opposite direction to that of the curve 32 and |HF|<|HR| is satisfied although the magnetic field HR on the rear end side and the magnetic field HF on the rear end side are set to the same direction.

As mentioned before, in order to increase the sensitivity of the element, the state of the curve 33 in which |HF|<|HR| is satisfied should be preferable. However, in the case of the magneto-resistive effect element including the magnetic flux guide layer 14 shown in FIG. 10, the current magnetic field HI and the bias magnetic field HB applied to the magnetic flux guide layer 14 affect the reproduced output of the element. That is, in the state shown by the curve 33,

|HF| is small so that the sensitivity can be increased at the front end in which the magnetic flux efficiency is high. However, since |HR| is large, a magnetic flux extracting effect at the portions behind the element bodies 11A and 11B of the magnetic flux guide layer 14 becomes small so that magnetic flux directly leaked from the element bodies 11A and 11B to the magnetic shields is increased unavoidably.

On the other hand, in the state shown by the curve 32, since |HF| is large, although the sensitivity is lowered at the front end in which the magnetic flux efficiency is high, |HR| is small with the result that the magnetic flux extracting effect at the portions behind the element bodies 11A and 11B of the magnetic flux guide layer 14 is increased. Thus, it is possible to decrease the magnetic flux directly leaked from the element bodies 11A and 11B to the magnetic shields.

That is, we cannot always say which reproduced output is higher in intensity between the state shown by the curve 33 in which the sensitivity of the element is small but the magnetic flux leakage is large and the state shown by the curve 32 in which the sensitivity of the element is small but the magnetic flux leakage is small, and the reproduced output is changed depending upon the structure and dimension of the element. Accordingly, which configuration to select should be determined in accordance with the structure and dimension of the element.

Further, when a difference between the reproduced output in the state shown by the curve 32 and in the state shown by the curve 33 is not so large, it should be preferable to select the configuration which can present the state of the curve 32 in which the sum of the current magnetic field HI and the bias magnetic field HB is large at the front end in which the contribution to the reproduced output is large and the stability is excellent.

That is, according to the configuration of the present invention, since the total magnetic fields are set to the same direction over the whole region of the front and the rear of the free layer 1, the free layer is nucleated as a single magnetic domain over the whole region, thereby improving the Barkhausen noise effectively. In addition, by increasing the magnitude of the total magnetic field at the front end or the rear end of the free layer, there can be achieved the effect that the sensitivity can be increased much more or the stability can be improved.

Further, while the magnetic head 100 according to the present invention can be used as a head for detecting a signal from a magnetic recording medium, i.e., a reproducing head, when the magnetic head according to the present invention comprises a recording and reproducing head, an induction type thin-film recording head is disposed on the second magnetic shield and electrode 22, for example, shown in FIG. 1 or 2, for example, and thereby can be integrally formed with the above recording head as one body.

Figure 11:
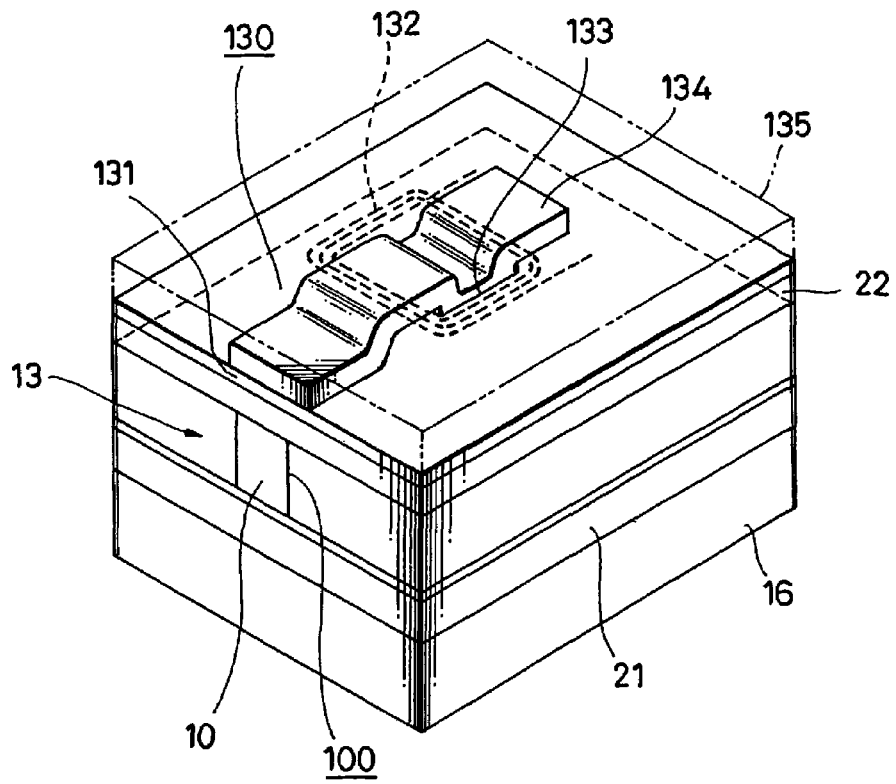
FIG. 11 is a schematic perspective view showing an example of a recording and reproducing magnetic head using a magnetic head according to the present invention.
Figure 12:
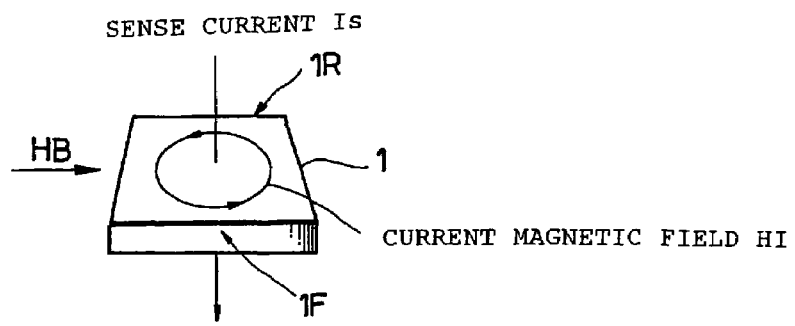
FIG. 12 is a diagram showing a sense current and a current magnetic field.

FIG. 11 shows a schematic perspective view of such example. In this example, the magnetic head according to the present invention can be constructed as a magnetic recording and reproducing head by laminating an electromagnetic induction type thin-film magnetic recording head 130, for example, on the inventive magnetic head 100 using the MR element according to the present invention as a magnetic sensing portion.

Then, at the portion which faces the forward surface 13, there is formed a nonmagnetic layer 131 made of an SiO$_2$ layer and the like, for example, comprising the magnetic gap of the recording head 130.

Then, a coil 132, which is formed by patterning a conductive layer, for example, is formed on the rear portion. An insulating layer is deposited on the coil 132, and a through-hole 133 is bored through the insulating layer and the nonmagnetic layer 131 at its central portion of this coil 132 to thereby expose the second shield and electrode 2.

On the other hand, the front end of the forward surface 3 is opposed to the nonmagnetic layer 131 and, on the nonmagnetic layer 131, there is formed a magnetic core layer 134 which is brought in contact with the second shield and electrode layer 22 exposed through the through-hole 133 across the portion in which the coil 132 is formed.

In this manner, there is constructed the electromagnetic induction type thin-film recording head 130 in which a magnetic gap g prescribed by the thickness of the nonmagnetic layer 131 is formed between the front end of the magnetic core layer 134 and the second shield and electrode layer 2.

On this magnetic head 130, there is formed a protecting layer 135 comprised of an insulating layer as shown by a dot-and-dash line.

As described above, there can be constructed the recording and reproducing magnetic head 130 in which the magneto-resistive effect type reproducing magnetic head 100 according to the present invention and the thin-film type recording head 130 are laminated and thereby integrated as one body.

The present invention is not limited to the above-mentioned examples and can be modified as various types of magneto-resistive effect elements such as a so-called synthetic type, a single or dual type in which a fixed layer, for example, is formed as a lamination layer ferri-structure. Further, materials and thicknesses of respective layers are not limited to the above-mentioned examples and can be variously modified.

As described above, according to the configuration of the present invention, the magneto-resistive effect element has the magnetic shield type configuration in which the magneto-resistive effect element is disposed between the first and second magnetic shields and has also the CPP type configuration. Under the condition that the detection magnetic field is not applied to this configuration, since the directions of the magnetic fields substantially applied to the free layer, i.e., the directions of the total magnetic fields are set to the same direction at the front end and the rear end, in actual practice, over the front end and the rear end, the free layer can be nucleated as the single magnetic domain over the whole region of the side end portion of the free layer. As a result, the Barkhausen noise can be improved effectively.

Further, since the respective total magnetic fields |HF| and |HR| are selected so as to satisfy |HF|<|HR| or |HF|>|HR|, the stability or sensitivity of the magneto-resistive effect element can be improved much more. Therefore, there can be constructed the magneto-resistive effect element which is excellent in reproducibility and the magnetic head which uses this magneto-resistive effect element as the magnetic sensing portion.

LIST OF REFERENCE NUMERALS AND ITEMS

| Reference Numerals | Items |
| --- | --- |
| 1 | the free layer |
| 1F | the front end |
| 1R | the rear end |
| 2, 2A, 2B | the fixed layers |
| 3, 3A, 3B | the antiferromagnetic layers |
| 4, 4A, 4B | the spacer layers |
| 5 | the underlayer |
| 6 | the magnetic gap layer |
| 7 | the capping layer |
| 10 | the MR element |
| 11 | the MR element body |
| 12 | the hard magnetic layer |
| 13 | the forward surface |
| 14 | the magnetic flux guide layer |
| 15 | the insulating layer |
| 16 | the substrate |
| 100 | the MR type magnetic head |
| 130 | the magnetic induction type thin-film magnetic head |
| 131 | the nonmagnetic layer |
| 132 | the coil |
| 133 | the through-hole |

-continued

LIST OF REFERENCE NUMERALS AND ITEMS

| Reference Numerals | Items |
| --- | --- |
| 134 | the magnetic core layer |
| 135 | the protecting layer |

The invention claimed is:

1. A magneto-resistive effect element comprising:
a magneto-resistive effect element body and a hard magnetic layer for applying a bias magnetic field to said magneto-resistive effect element body disposed between opposing first and second magnetic shields, each of the magnetic shields made of a soft magnetic material;
the magneto-resistive effect element body having a lamination layer film oriented in a film plane direction parallel with said first and second magnetic shields, the lamination layer film comprising:
a free layer the magnetization of which is rotated in response to an external magnetic field;
a fixed layer;
an antiferromagnetic layer; and
a spacer layer interposed between said free layer and said fixed layer;
the hard magnetic layer being formed in two portions disposed at positions opposite respective side end portions of said free layer;
the magnet-resistive effect element configured such that a sense current flows to said magneto-resistive effect element body in the direction intersecting the film plane direction of said lamination layer film and a detection magnetic field is introduced in the direction extending along the film plane direction of said lamination layer film, said bias magnetic field is applied in substantially the direction intersecting the direction in which said detection magnetic field is introduced and in the direction extending along said film plane direction and directions of magnetic fields substantially applied to the front end and the rear end of the side into which said detection magnetic field is introduced are set to the same direction in said free layer under the condition that said detection magnetic field is not applied to said magneto-resistive effect element.

2. A magneto-resistive effect element according to claim 1, characterized in that said magnetic fields substantially applied to the front end and the rear end of the side into which said detection magnetic field is introduced in said free layer under the condition that said detection magnetic field is not applied to said magneto-resistive effect element are increased in said rear end side.

3. A magneto-resistive effect element according to claim 1, characterized in that said magnetic fields substantially applied to the front end and the rear end of the side in which said detection magnetic field is introduced in said free layer under the condition that said detection magnetic field is not applied are increased in said front end side.

4. A magneto-resistive effect element according to claim 1, 2 or 3, characterized in that said magneto-resistive effect element body has a spin-valve type configuration in which said spacer layer is comprised of a nonmagnetic conductive layer.

5. A magneto-resistive effect element according to claim 1, 2 or 3, characterized in that said magneto-resistive effect element body has a tunnel type configuration in which said spacer layer is comprised of a tunnel barrier layer.

6. A magnetic head using magneto-resistive head characterized in that a magnetic sensing portion of the magnetic head is comprised of a magneto-resistive effect element, said magneto-resistive effect element comprising:

a magneto-resistive effect element body and a hard magnetic layer for applying a bias magnetic field to said magneto-resistive effect element body disposed between opposing first and second magnetic shields, each of the magnetic shields made of a soft magnetic material;

the magneto-resistive effect element body having a lamination layer film oriented in a film plane direction parallel with said first and second magnetic shields, the lamination layer film comprising:

a free layer the magnetization of which is rotated in response to an external magnetic field;

a fixed layer;

an antiferromagnetic layer; and a spacer layer interposed between said free layer and said fixed layer;

the hard magnetic layer being formed in two portions disposed at positions opposite respective side end portions of said free layer;

the magnet-resistive effect element configured such that a sense current flows to said magneto-resistive effect element body in the direction intersecting the film plane direction of said lamination layer film and a detection magnetic field is introduced in the direction extending along the film plane direction of said lamination layer film, said bias magnetic field is applied in substantially the direction intersecting the direction in which said detection magnetic field is introduced and in the direction extending along said film plane direction and directions of magnetic fields substantially applied to the front end and the rear end of the side into which said detection magnetic field is introduced are set to the same direction in said free layer under the condition that said detection magnetic field is not applied to said magneto-resistive effect element.

7. A magnetic head using magneto-resistive head according to claim 6, characterized in that said magnetic fields substantially applied to the front end and the rear end of the side into which said detection magnetic field is introduced under the condition that said detection magnetic field is not applied to said magneto-resistive effect element are increased in intensity in said rear end side of said free layer.

8. A magnetic head using magneto-resistive head according to claim 6, characterized in that said magnetic fields substantially applied to the front end and the rear end of the side into which said detection magnetic field is introduced under the condition that said detection magnetic field is not applied to said magneto-resistive effect element are increased in intensity in said front end side of said free layer.

9. A magnetic head using magneto-resistive head according to claim 6, 7 or 8, characterized in that said magneto-resistive effect element body has a spin-valve type configuration in which said spacer layer is comprised of a nonmagnetic conductive layer.

10. A magnetic head using magneto-resistive head according to claim 6, 7 or 8, characterized in that said magneto-resistive effect element body has a tunnel type configuration in which said spacer layer is comprised of a tunnel barrier layer.

* * * * *